(12) United States Patent
Yoshizawa

(10) Patent No.: US 6,740,459 B2
(45) Date of Patent: May 25, 2004

(54) METHOD OF DESIGNING PHOTOSENSITIVE COMPOSITION AND LITHOGRAPHY PROCESS

(75) Inventor: Masaki Yoshizawa, Kanagawa (JP)

(73) Assignee: Sony Corporation (JP)

( * ) Notice: Subject to any disclaimer, the term of this patent is extended or adjusted under 35 U.S.C. 154(b) by 50 days.

(21) Appl. No.: 10/101,171

(22) Filed: Mar. 20, 2002

(65) Prior Publication Data

US 2002/0168585 A1 Nov. 14, 2002

(30) Foreign Application Priority Data

Mar. 27, 2001 (JP) .................................... P2001-089063

(51) Int. Cl.$^7$ ................................................ G03C 5/00
(52) U.S. Cl. ................ 430/30; 430/270.1; 430/296; 430/311; 430/348; 430/494; 430/942
(58) Field of Search .............. 430/30, 270.1, 430/296, 302, 311, 348, 494, 944, 945, 942

(56) References Cited

U.S. PATENT DOCUMENTS 6,180,320 B1 * 1/2001 Saito et al. .................. 430/311
6,487,503 B2 * 11/2002 Inui ............................ 702/22
6,548,214 B2 * 4/2003 Yoshizawa et al. ........... 430/30

OTHER PUBLICATIONS

Wolfgang Henke and Michael Torkler, "Modeling of Edge Roughness in Ion Projection Lithography" Article 1, Journal of Vacuum Science and Technology, B17 (6) (1999–Nov./Dec.) USA, p. 3122–3118.

* cited by examiner

Primary Examiner—Janet Baxter
Assistant Examiner—Barbara Gilliam
(74) Attorney, Agent, or Firm—Rader, Fishman & Grauer PLLC; Ronald P. Kananen

(57) ABSTRACT

A method of designing a chemical amplification type photosensitive composition containing an acid generating agent, wherein the average distance between exposure particles in an exposure area of the photosensitive composition upon pattern exposure of the photosensitive composition or the average distance between the acids generated by the pattern exposure is calculated based on the sensitivity required of the photosensitive composition, and the composition of the photosensitive composition is set so that the diffusion length of the acid generated from the acid generating agent by the pattern exposure is greater than the calculated average distance.

6 Claims, 4 Drawing Sheets

METHOD OF DESIGNING PHOTOSENSITIVE COMPOSITION AND LITHOGRAPHY PROCESS

BACKGROUND OF THE INVENTION

The present invention relates to a method of designing a photosensitive composition and a lithography process and particularly to a method of designing a photosensitive composition containing an acid generating agent and a lithography process using the photosensitive composition.

In the process of fabricating a semiconductor device, a photosensitive composition (so-called resist) is patterned by a lithographic treatment, and etching is conducted by using the pattern of the photosensitive composition as a mask.

Accordingly, as demand has increased for a finer semiconductor device in recent years, shortening of the wavelength of exposure radiation has been progressing in pattern exposure in the lithographic treatment. Therefore, in addition to lithography with the KrF excimer laser light presently used, lithography processes using ArF, $F_2$, EUV, X-rays, charged particle beams such as electron beam or the like as exposure radiation have been proposed. On the other hand, in order to enhance the through-put in pattern exposure, a chemical amplification type photosensitive composition with a higher sensitivity has come to be used in lithography using such exposure radiations.

The chemical amplification type photosensitive composition contains an acid generating agent capable of generating an acid upon irradiation with the exposure radiation. Due to the presence of the acid generated in the photosensitive composition upon irradiation with exposure radiation, a cross-linking reaction proceeds in the photosensitive composition in the case of the negative type, while a decomposition reaction proceeds in the photosensitive composition in the case of the positive type. Accordingly, pattern exposure can be achieved with less exposure dose.

Meanwhile, in the case where enhancement of the sensitivity of the photosensitive composition proceeds, the irradiation amount of the exposure radiation (namely, exposure dose) onto an exposure area is decreased. FIG. 8 shows, by way of example, the relationship between the exposure dose in electron beam lithography and the average distance between exposure particles in the exposure area. As shown in the figure, the average distance between the exposure particles in the exposure area increases as the exposure dose is decreased by the enhancement of sensitivity, and it is seen that the statistic dispersion of the exposure particles in the exposure area at the time of pattern exposure is greater as the sensitivity of the photosensitive composition is higher. This becomes conspicuous when the sensitivity is enhanced from the sensitivity realized in electron beam lithography at present (exposure dose 5 $\mu C/cm^2$) to a higher sensitivity of not more than 1 $\mu C/cm^2$. In addition, where the efficiency of generation of acid in relation to the incident electrons (exposure particles) is low, the average distance between the acids is enlarged accordingly, and the statistic dispersion of the locations of presence of the acid contributing to the reaction of the photosensitive composition is enlarged.

It is known that, where the statistic dispersion of the exposure particles in the exposure area is thus enlarged, the edge roughness of end portions of a resist pattern formed by lithography is enlarged due to the statistic dispersion of the exposure particles, as described in Article 1 in the Journal of Vacuum Science and Technology, B17[6] (1999-11, 12) (USA) Wolfgang Henke and Michael Torkler, p.3112–3118.

This applies also to the above-mentioned chemical amplification type photosensitive composition, and the enlargement of the edge roughness causes a lowering in the resolution of the photosensitive composition.

SUMMARY OF THE INVENTION

Accordingly, it is an object of the present invention to provide a method of designing a chemical amplification type photosensitive composition capable of forming a pattern with a sufficient resolution, irrespectively of the sensitivity of the photosensitive composition and even where the sensitivity is further enhanced, and a lithography process using the chemical amplification type photosensitive composition.

In order to attain the above object, the method of designing a photosensitive composition according to the present invention is a method of designing a chemical amplification type photosensitive composition containing an acid generating agent and is characterized by the following procedure. First, the average distance between exposure particles in an exposure area of the photosensitive composition at the time of pattern exposure of the photosensitive composition is calculated based on the sensitivity required of the photosensitive composition. Next, the composition of the photosensitive composition is so that the average value of diffusion length of the acid generated from the acid generating agent upon pattern exposure is greater than the calculated average distance between the exposure particles.

According to the designing method discussed above, the composition of the photosensitive composition is set so that the acid generated from the acid generating agent diffuses with a diffusion length greater than the average distance between the exposure particles. Therefore, in the photosensitive composition, when pattern exposure is conducted, the acid generated upon the pattern exposure diffuses over a wide range in excess of the average distance between the exposure particles. Accordingly, even where the photosensitive composition has a high sensitivity, so that the exposure dose at the time of pattern exposure is small and the statistic dispersion of the exposure particles in the photosensitive composition is large, the edge roughness arising from the dispersion is mitigated.

Another designing method according to the present invention is a method in which the average distance between the acids generated from the acid generating agent upon pattern exposure is calculated, and the composition of a photosensitive composition is set so that the average value of diffusion length of the acid in the photosensitive composition is greater than the calculated average distance. According to such a designing method, when the pattern exposure is carried out, the acid generated upon the pattern exposure diffuses over a wide range in excess of the average distance between the acids. Therefore, even where the photosensitive composition has a high sensitivity, so that the exposure dose at the time of pattern exposure is small and the statistic dispersion of the exposure particles in the photosensitive composition is large, namely, where the statistic dispersion of the acid is large, the edge roughness arising from the dispersion is mitigated. In addition, in this designing method, designing is so conducted that the diffusion length of the acid exceeds the average distance between the acids, and, accordingly, even where the efficiency of generation of the acid in relation to the exposure particles is low, the statistic dispersion of the acid contributing to the reaction of the photosensitive composition is mitigated, and mitigation of the edge roughness is securely contrived.

The lithography process according to the present invention is a lithography process in which a chemical amplification type photosensitive composition containing an acid generating agent is subjected to pattern exposure, and thereafter a developing treatment is carried out; and it is characterized by the following procedure. First, the average distance between exposure particles in an exposure area of the photosensitive composition at the time of pattern exposure is calculated based on the exposure dose at the time of the pattern exposure. Next, lithography conditions, for example, heating conditions of the photosensitive composition before and after the pattern exposure, and concretely, heating temperature, heating period, heating atmosphere and the like, are set so that the average value of the diffusion length of the acid generated from the acid generating agent upon pattern exposure is greater than the calculated average distance between the exposure particles.

According to such a lithography process, the heating temperature conditions for the photosensitive composition before and after the pattern exposure are set so that the acid generated from the acid generating agent in the photosensitive composition upon pattern exposure diffuses with a diffusion length greater than the average distance between the exposure particles. Therefore, in the photosensitive composition, the acid generated by the pattern exposure diffuses over a wide range in excess of the average distance between the exposure particles. Accordingly, even where the pattern exposure is carried out with a low exposure dose and the statistic dispersion of the exposure particles in the exposure area is large, the dispersion is alleviated by the diffusion of the acid.

Another lithography process according to the present invention is a process in which the average distance between the acids generated from the acid generating agent upon pattern exposure is calculated, and lithography conditions are set so that the average value of the diffusion length of the acid in the photosensitive composition is greater than the calculated average distance. According to such a lithography process, in the photosensitive composition, the acid generated by the pattern exposure diffuses over a wide range in excess of the average distance between the acids. Therefore, even where the pattern exposure is carried out with a low exposure dose and the statistic dispersion of the exposure particles in the exposure area is large, namely, where the statistic dispersion of the acid generation is large, the dispersion is alleviated by the diffusion of the acid. In addition, according to this lithography process, the conditions are set so that the diffusion length of the acid exceeds the average distance between the acids, so that even where the efficiency of the generation of the acid in relation to the exposure particles is low, mitigation of the statistic dispersion of the acid contributing to the reaction of the photosensitive composition can be contrived.

The above and other objects, features and advantages of the present invention will become apparent from the following description and appended claims, taken in conjunction with the accompanying drawings, which show by way of example some preferred embodiments of the invention.

DETAILED DESCRIPTION OF THE PREFERRED EMBODIMENTS

Figure 1:
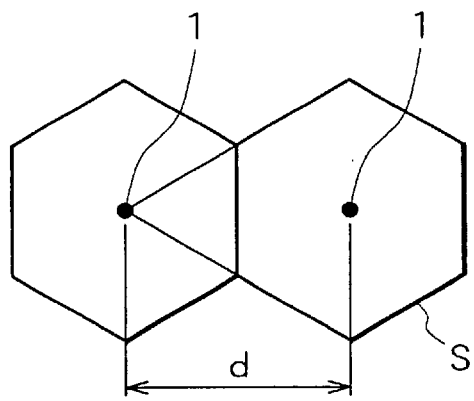
FIG. 1 is a diagram illustrating the calculation of the average distance between exposure particles.

Now, embodiments of the present invention will be described below referring to the drawings. In the following embodiments, electron beam lithography using an electron beam as exposure radiation is assumed, and an embodiment of the method of designing a photosensitive composition used for electron beam lithography will first be described, followed by a description of an embodiment of the electron beam lithography process. Naturally, the present invention is not limited to or by the photosensitive composition for use in electron beam lithography and the electron beam lithography process, and it can be applied to photosensitive compositions corresponding to various exposure radiations and the lithography processes using the photosensitive compositions.

Method of Designing Photosensitive Composition

First, the sensitivity of the photosensitive composition as the object of designing is set. Here, for example, the sensitivity D of the photosensitive composition is set to be $D=0.1 \ \mu C/cm^2$.

Next, the average distance between exposure particles in the photosensitive composition upon pattern exposure or the average distance between acids is calculated. Here, the term "exposure particles" means the particles of the exposure radiation; concretely, electrons in the case where the exposure radiation is an electron beam, photons in the case where the exposure radiation is light, and ions in the case where the exposure radiation is an ion. Further, the term "average distance between the exposure particles" means the interval between the exposure particles in an exposure area in the case where each photosensitive composition is irradiated with exposure radiation at an optimum exposure dose for the sensitivity of the photosensitive composition. Moreover, the term "average distance between the acids" means the average distance between the acids generated in the exposure area upon pattern exposure; where the efficiency of generation of the acid in relation to the incident exposure particles is less than 1, the average distance between the acids is greater than the average distance between the exposure particles, and the effective exposure dose is reduced. Therefore, the average interval of the acids generated is greater as the efficiency of generation of the acid is lower.

Here, in the exposure of a photosensitive composition having a sensitivity D, the area S occupied by one exposure particle in the photosensitive composition is represented by the following equation (1), in which e is the elementary electric charge. Furthermore, for example, where only 0.5 piece of acid is generated upon incidence of one exposure particle, the exposure dose D in the following equation (1) becomes 0.5D.

$$S = e[C]/D[\mu C/\text{cm}^2] \quad (1)$$
$$= 1.6 \times 10^{-19} [C]/D \times 10^{-2} [C/\text{m}^2]$$
$$= 16 \times 10^{-18} /D[\text{m}^2/\text{piece}]$$
$$= 16/D[\text{nm}^2/\text{piece}]$$

In addition, for example, as shown in FIG. 1, where it is assumed that the exposure particle 1 is disposed in the center of hexagon so that the exposure particles 1 are in a close-packed arrangement in the exposure area, the area S in the case where the average distance between the exposure particles is d is given by the following equation (2). Here, when the average distance between the acids generated in the exposure area is to be calculated, the average distance d is the average distance d between the acids.

$$S = 6 \times (\tfrac{1}{2}) \times (d/2) \times (d/\sqrt{3}) \quad (2)$$

In addition, from the above equations (1) and (2), the average distance d between the exposure particles is calculated as the following equation (3).

$$16/D = 6 \times (1/2) \times (d/2) \times (d/\sqrt{3}) \quad (3)$$
$$d = \sqrt{\{32/(D\sqrt{3})\}}$$

From equation (3), the average distance d between the exposure particles in the case where the sensitivity $D=0.1$ $\mu C/\text{cm}^2$ is calculated as $d=13.6$ nm. For comparison, the average distance d between the exposure particles in the case where the sensitivity $D=10$ $\mu C/\text{cm}^2$ is calculated as $d=1.4$ nm. Thus, it is seen that as the sensitivity D is set to be higher, the average distance d between the exposure particles is greater, and the dispersion of the presence of the exposure particles and the acid generated by exposure in the photosensitive composition upon exposure is greater.

After the average distance $d=13.6$ nm between the exposure particles in the exposure area is determined based on the sensitivity $D=0.1$ $\mu C/\text{cm}^2$ in this manner, the composition of the photosensitive composition is set based on the average distance d. In this case, it is important that the composition of the photosensitive composition is set so that the average value of the diffusion length of the acid generated from the acid generating agent is greater than the calculated average distance d. In the case where the average distance d in the above calculation is calculated as the average distance between the acids generated in the exposure area, the composition of the photosensitive composition is set so that the average value of the diffusion length of the acid generated from the acid generating agent is greater than the calculated average distance d.

As for the diffusion length of the acid, upper limit is set taking into consideration the interval of patterns actually formed by lithography, in a range greater than the average distance d. The upper limit is set to be lower as the pattern interval is smaller; for example, in lithography in the process of fabricating a semiconductor device, the upper limit is set in accordance with the smallest pattern interval.

Furthermore, here, the temperature setting in the heating step in the lithography using the photosensitive composition is taken into consideration, and the composition of the photosensitive composition is set so that the diffusion length of the acid is realized with the temperature setting. In setting the composition of the photosensitive composition, for example, the kind of acid generating agent may be selected, or the degree of dispersion of the molecular weight of a base resin constituting the photosensitive composition may be controlled, whereby the acid diffusion length set as above is realized.

According to such a designing method, the photosensitive composition is set so that the acid generated from the acid generating agent diffuses with a diffusion length greater than the average distance $d=13.6$ nm between the exposure particles. Therefore, in the photosensitive composition, when pattern exposure is carried out with an exposure dose at the set sensitivity $D=0.1$ $\mu C/\text{cm}^2$, the acid generated in the exposure area diffuses over a wide range in excess of the average distance $d=13.6$ nm between the exposure particles.

Therefore, even where pattern exposure is conducted for a photosensitive composition enhanced in sensitivity to have a sensitivity $D=0.1$ $\mu C/\text{cm}^2$ and the statistical dispersion of the exposure particles in the exposure area is large, the acid diffuses over a wide range in excess of the average distance between the exposure particles, whereby the reaction of the photosensitive composition by the acid (cross-linking reaction or decomposing reaction) occurs also in the diffusion area. Accordingly, at end portions of the exposure area, the edge roughness due to the statistical dispersion of the exposure particles can be mitigated.

In addition, the edge roughness can also be mitigated in the same manner in the case where the average distance between the acids generated from the acid generating agent upon pattern exposure is calculated and the composition of the photosensitive composition is set so that the diffusion length of the acid exceeds the calculated average distance. Particularly, in this case, even where the efficiency of generation of the acid in relation to the exposure particles is low, the statistic dispersion of the acid contributing to the reaction of the photosensitive composition is alleviated, and mitigation of the edge roughness can be securely contrived.

Here, the term "edge roughness" means the degree of recesses and projections at edge portions of the pattern of the photosensitive composition (so-called resist pattern) formed by lithography, and is represented, for example, by the average value of the difference between the maximum and the minimum of the line width in each divisional area of the resist pattern. The edge roughness is a value sensitively reflecting the variations of lithography conditions with good reproducibility, and it has a linear relationship with resolution. Therefore, the fact that mitigation of the edge roughness can be contrived means that the resolution of the photosensitive composition can be secured and enhanced.

As a result, by designing the photosensitive composition as described above, it is possible to obtain a photosensitive composition having a good resolution in spite of the high sensitivity.

Figure 2:
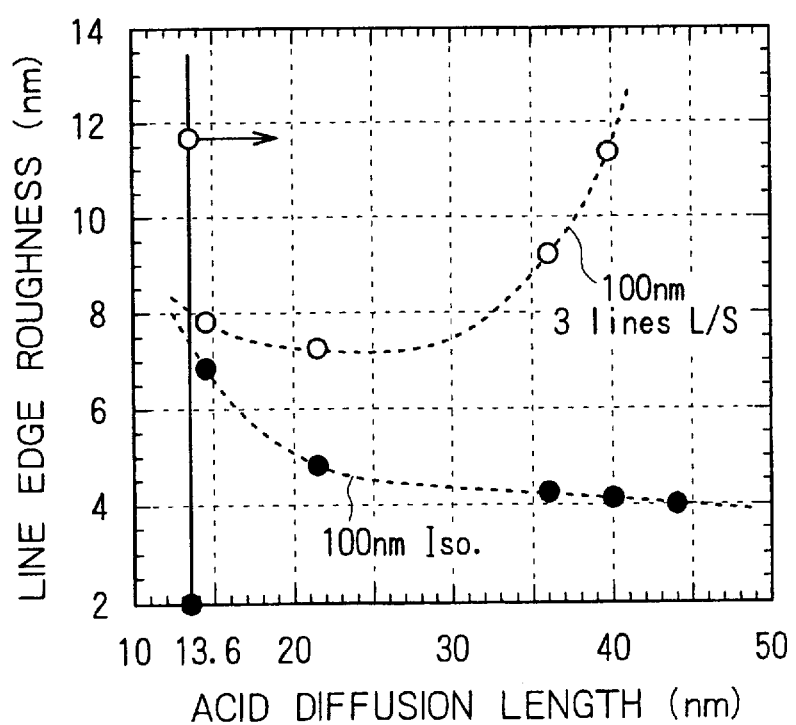
FIG. 2 is a graph showing the relationship between the diffusion length of an acid and the edge roughness of a resist pattern in an exposure area of a photosensitive composition.

FIG. 2 shows the relationship between the diffusion length of the acid and edge roughness. As shown in the graph of an isolated pattern with a line width of 100 nm (100 nm Iso), it is seen that the edge roughness is smaller as the diffusion length of the acid is greater. Namely, it is shown that the statistical dispersion of the presence of the exposure particles in the photosensitive composition is mitigated by the diffusion of the acid. Therefore, by designing the photosensitive composition so that the diffusion length of the acid is greater than the average distance between the exposure particles (for example, $d=13.6$ nm in the case of the sensitivity $D=0.1$ $\mu C/\text{cm}^2$), as in this designing method, it is possible to ensure that the acid generated by exposure diffuses over a range in excess of the average distance between the exposure particles, whereby the edge roughness due to the above-mentioned dispersion can be drastically mitigated.

On the other hand, as shown in the graph of an LS pattern comprising three line patterns arranged side by side (100 nm 3 lines L/S), it is seen that the edge roughness of the LS pattern has a minimum value in relation to the diffusion length of the acid. This is due to the influence of acid diffusion from adjacent patterns in the lithography for formation of the LS pattern. Therefore, in designing the photosensitive composition applied to the formation of an LS pattern, such as a semiconductor device, an upper limit is set to the diffusion length of the acid so that the edge roughness lies in the vicinity of the minimum value.

The relationship between the edge roughness and the diffusion length of the acid shown in FIG. 2 was obtained as follows. Here, a description was made by taking the case of obtaining the relationship between the edge roughness and the acid diffusion length concerning the isolated pattern, but the same also applies to the case of the LS pattern.

Figure 3:
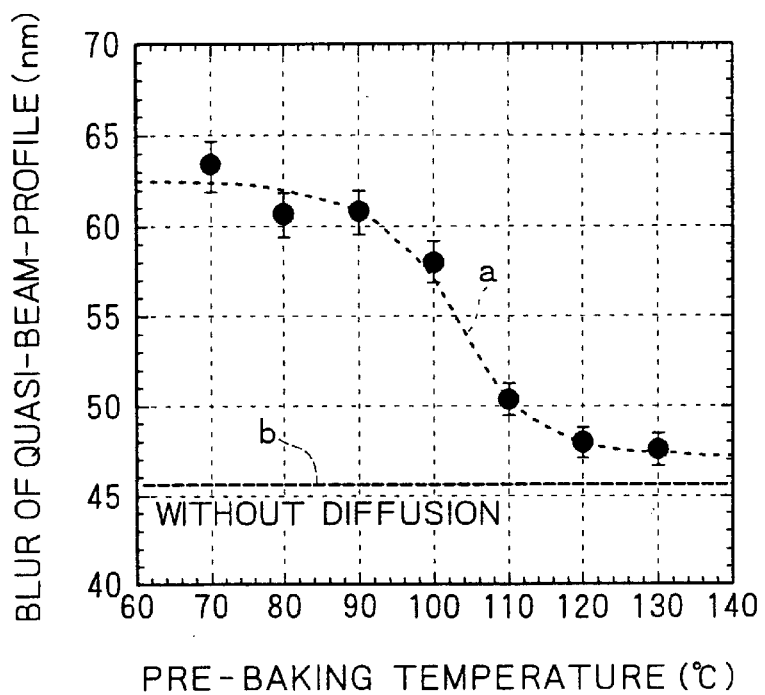
FIG. 3 is a diagram showing the relationship between the pre-baking (PB) temperature in lithography and the blur of quasi-beam profile.

First, as shown in FIG. 3, the beam blur amount for a quasi-beam profile (QBP) with the blur due to the diffusion length of the acid varied was calculated based on the edge roughness evaluation method (ERE method) described in Japanese Patent Application No. Hei 11-265076. Here, the term "quasi-beam profile" means a quasi-beam profile (intensity distribution of exposure radiation) including blurs due to all factors affecting the accuracy of lithography (namely, lithography factors), and naturally includes the blur due to acid diffusion. The quasi-beam profile is a value sensitively reflecting the value of edge roughness.

Here, a pattern is formed by lithography in which the pre-baking (PB) temperature, being a control factor for the diffusion length of the acid, is a factor whereby the blur amount due to the acid diffusion length is varied. Namely, when the PB temperature is raised, a residual solvent through which the acid diffuses is evaporated, whereby the diffusion length of the acid is shortened. On the other hand, when the PB temperature is lowered, the variation of the acid diffusion length due to the dispersion ratio of the molecular weight of the resist predominates over the amount of the residual solvent through which the acid diffuses, and the acid diffusion length is saturated.

In this lithography, a chemical amplification type negative resist NEB22, a product by Sumitomo Chemical Co., Ltd., was used as a photosensitive composition, and the photosensitive composition was applied to a substrate in a thickness of 250 nm. The photosensitive composition was first subjected to PB at each temperature for 120 sec.

The resist applied to a wafer was subjected to double exposure by use of, for example, an electron beam drawing-type exposure device HL800D, a product by Hitachi, Ltd. Namely, a line pattern with a designed line width of 100 nm, for example, was drawn by exposure with an exposure dose of 10 $\mu C/cm^2$, and then total area exposure over the range of 65 $\mu m \times 65$ $\mu m$, for example, was conducted with the line pattern as a center. Such a double exposure was repeated with the exposure dose in total area exposure as a factor.

Figures 4A, 4B:
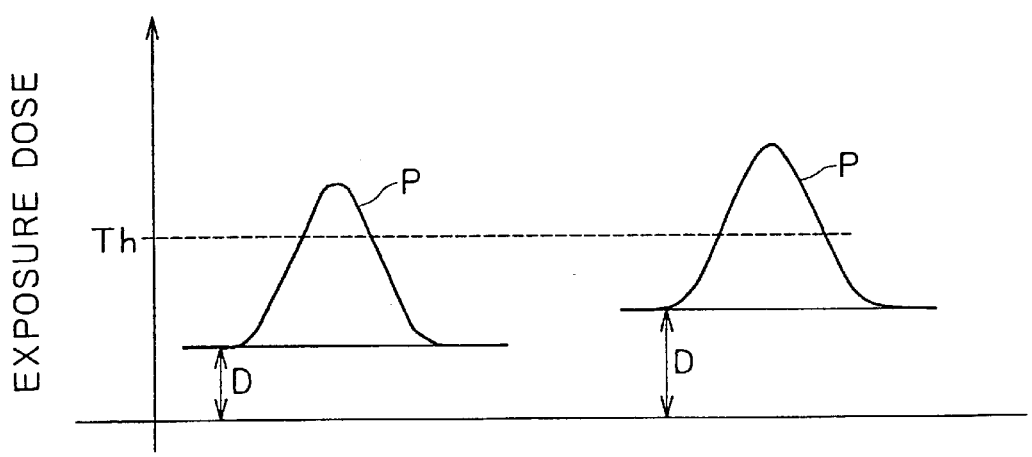
FIGS. 4A and 4B are diagrams showing double exposure for obtaining a quasi-beam profile.

Thus, the double exposure with the exposure dose D in the total area exposure as a factor is carried out, as shown in FIGS. 4A and 4B, while the intensity distribution of the exposure radiation, namely, beam profile p in exposure of the isolated line is maintained, threshold Th is varied equivalently to the beam profile p. The term "beam profile" here means the so-called quasi-beam profile p including the variations due to all factors affecting the accuracy of lithography (namely, lithography factors). As the lithography factors, there may be mentioned, for example, the exposure optical system, the kind of photosensitive composition, the resist process, the development conditions, the degree of deterioration of the mask, the diffusion length of the acid in the photo-sensitive composition, and so on.

Figure 5:
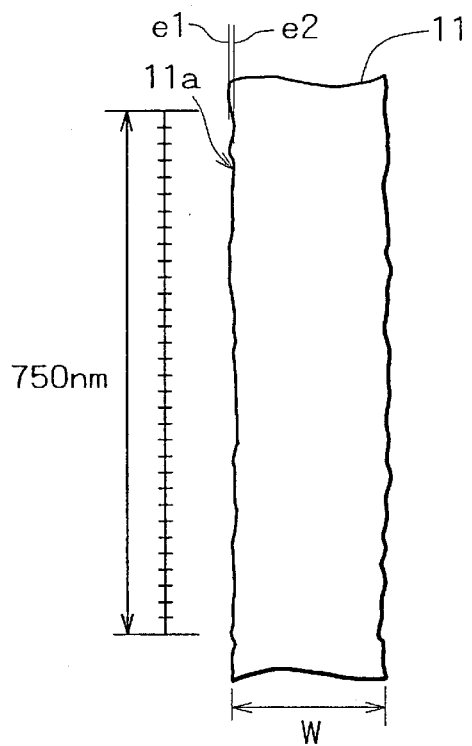
FIG. 5 is a diagram showing the edge roughness of a resist pattern.

After the double exposure post-exposure baking (PEB) at 100° C. for 120 sec and a developing treatment were carried out, whereby each resist pattern was formed. Thereafter, for each resist pattern thus formed, edge roughness and line width were measured. Here, as one example of the measurement of edge roughness, as shown in FIG. 5, the region of 750 nm of edge portion 11a of the resist pattern 11 was divided into 32 portions, and the dispersion (3 $\sigma$) of the average position of the edge in each divisional region from a least square straight line was calculated and was made to be the edge roughness 3 $\sigma$.

Figure 6:
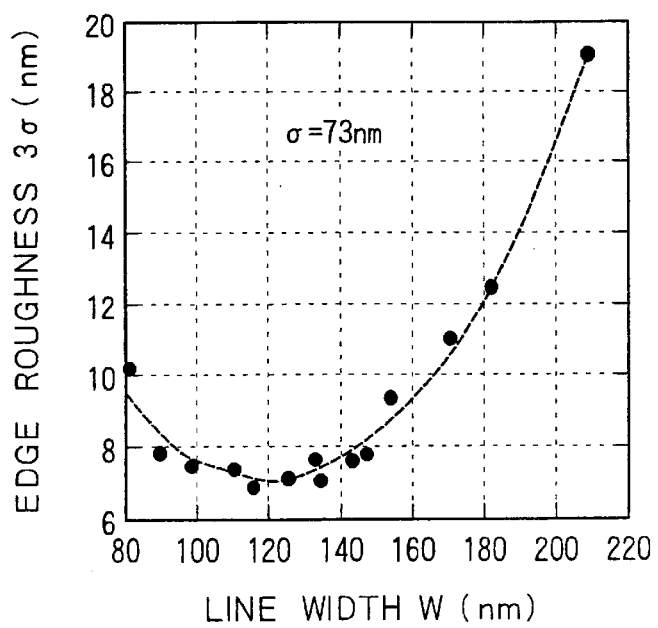
FIG. 6 is a graph showing the relationship between the edge roughness of each resist pattern and line width.

Next, as shown in FIG. 6, a Gaussian function (broken line in the figure) was fitted to the edge roughness 3 $\sigma$ and the line width W. In this case, the fitting was conducted by using the degree of dispersion (here, standard deviation $\sigma$) of the Gaussian function as a parameter, and the standard deviation $\sigma$ of the Gaussian function fitted (here, for example, $\sigma=73$ nm) was calculated as the blur a of the quasi-beam profile. The blur a was calculated for each lithography with the PB temperature as a factor.

On the other hand, as shown in FIG. 3, the other blur b, dependent on all other factors than the blur due to the diffusion length of the acid, was determined empirically or by simulation. The other blur b corresponds to the beam blur amount of the quasi-beam profile in the case of diffusion length=0. Then, the value $[\sqrt{(a^2-b^2)}]$ obtained by subtracting the other blur b from the beam blur amount a of the quasi beam profile under variation of the blur due to the diffusion length of the acid (namely, the PB temperature) was calculated as the blur dependent on the acid diffusion length, namely, as the diffusion length of the acid.

Then, the edge roughness measured for each resist pattern was made to correspond to the acid diffusion length [ $\sqrt{(a^2-b^2)}$], whereby the relationship (100 nm Iso) between the acid diffusion length and the edge roughness for the isolated pattern of FIG. 2 was obtained.

[Lithography Process]

Next, an embodiment of the lithography process will be described. Here, as an example, a lithography process using the photosensitive composition designed by the designing method described above will be described. The photosensitive composition is a chemical amplification type photosensitive composition containing an acid generating agent, and is set to have a sensitivity D=0.1 $\mu C/cm^2$. In addition, it is designed such that the diffusion length of the acid generated by exposure is greater than the average distance d=13.6 nm between the exposure particles (electrons) derived from the sensitivity. The acid diffusion length determined by the photosensitive composition is a value varied according to the lithography factors. Therefore, lithography is conducted as follows.

First, prior to conducting lithography by use of the photosensitive composition, an experimental lithography is carried out, whereby the lithography conditions required for ensuring that the diffusion length of the acid is greater than the average distance d=13.6 nm between the exposure particles are derived.

In this case, the quasi beam profile under variation of the lithography factors affecting the diffusion length of the acid is calculated by the above-mentioned ERE method. As the lithography factors affecting the diffusion length of the acid, there may be mentioned the above-mentioned PB temperature, the PEB temperature, the heating conditions such as the heating period and the heating atmosphere in the PB step and the PEB step, the amount of the solvent for controlling the coating material of the photosensitive composition, and so on.

Figure 7:
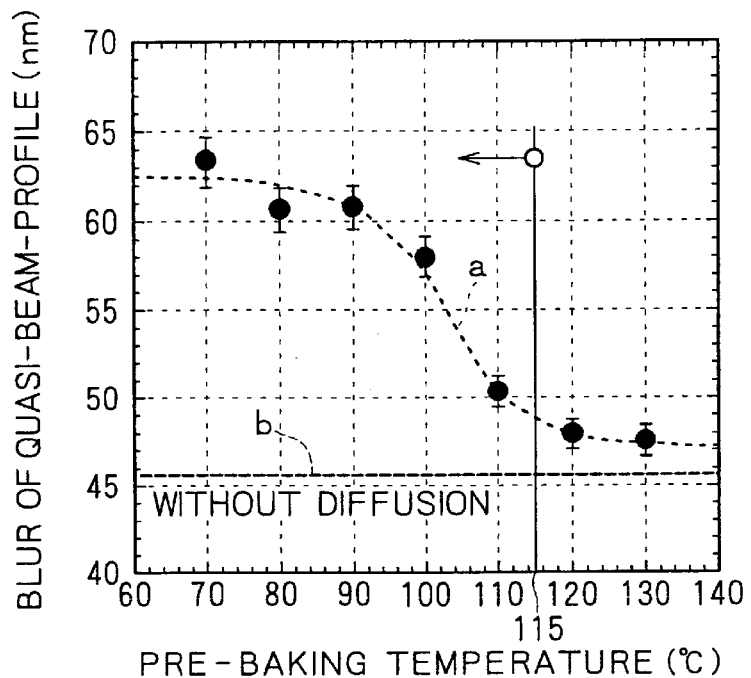
FIG. 7 is a diagram showing the relationship between the pre-baking (PB) temperature in lithography and the blur of a quasi-beam profile.
Figure 8:
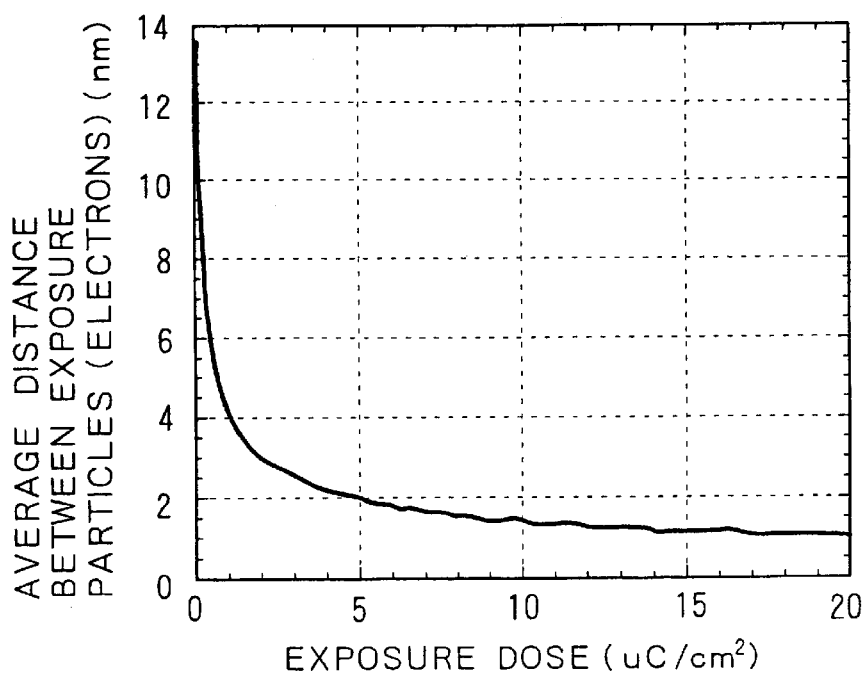
FIG. 8 is a graph showing the relationship between the exposure dose and the average distance between exposure particles (electrons).

For example, in the case of controlling the diffusion length of the acid by the PB temperature, formation of a pattern by lithography with the PB temperature as a factor is carried out, whereby the blur amount arising from the PB temperature, namely the acid diffusion length, is varied. Then, as for example shown in FIG. 7, the beam blur amount a for the quasi beam profile under variation of the blur arising from the PB temperature (acid diffusion length) is obtained. On the other hand, the blur amount b dependent on all other factors than the blur due to the PB temperature (acid diffusion length) is determined empirically or by simulation. Subsequently, the diffusion length w of the acid is calculated as $w=\sqrt{(a^2-b^2)}$ from the beam blur a of the quasi beam profile under variation of the blur amount due to the diffusion length of the acid and the other blur b.

Then, the PB temperature is set in a range of PB temperature such that the average distance of the exposure particles is d=13.6 nm<w. Here, since a≈48 nm where w=13.6 nm, the PB temperature is set in the range of PB temperature of less than 115° C. In the case where the average distance d is calculated as the average distance between the acids generated in the exposure area, the lithography conditions are so set that the average value of diffusion length of the acid generated from the acid generating agent is greater than the calculated average distance d.

Thereafter, lithography for actual pattern formation is carried out by adopting the PB temperature set as described above, the sensitivity D set for the photosensitive composition, and other lithography conditions at the time of formation of the quasi beam profile.

For the PB temperature, a lower limit is set taking into account the interval of patterns actually formed by lithography, in the range of average distance d=13.6 nm< $\sqrt{(a^2-b^2)}$. The lower limit is set at a higher value as the pattern interval is smaller; for example, in the lithography in the process of fabricating a semiconductor device, the lower limit is set in accordance with the smallest pattern interval.

Besides, also in the case where the diffusion length of the acid is controlled by the PEB temperature and the amount of the solvent, the range of the PEB temperature and the range of the solvent amount are set by the same procedure described above.

According to such a lithography process, the PB temperature (lithography conditions such as PEB temperature and solvent amount) is set so that the acid generated from the acid generating agent in the exposure area of the photosensitive composition at the time of pattern exposure diffuses with a diffusion length greater than the average distance d=13.6 nm between the exposure particles. Therefore, in the photosensitive composition, the acid generated by the pattern exposure diffuses over a range in excess of the average distance between the exposure particles. Accordingly, even where the lithography is carried out using a photosensitive composition having a high sensitivity of D=0.1 $\mu C/cm^2$ and the statistical dispersion of the exposure particles in the exposure area is large, the dispersion can be mitigated by the diffusion of the acid. Therefore, it is possible to conduct lithography with high resolution on a photosensitive composition having a high sensitivity.

In addition, where the lithography conditions are so set that the diffusion length of the acid is greater than the average distance between the acids generated from the acid generating agent upon pattern exposure, the edge roughness can be mitigated in the same manner. Particularly in this case, the statistical dispersion of the acid contributing to the reaction of the photosensitive composition can be mitigated even where the efficiency of generation of acid in relation to the exposure particles is low. Therefore, lithography with high resolution can be securely performed on a photosensitive composition having a high sensitivity.

The present invention is not limited to the details of the above-described preferred embodiments. The scope of the invention is defined by the appended claims and all changes and modifications as fall within the equivalence of the scope of the claims are therefore to be embraced by the invention.

What is claimed is:

1. A method of designing a chemical amplification type photosensitive composition containing an acid generating agent, comprising the steps of:

calculating the average distance between exposure particles in an exposure area of said photosensitive composition upon pattern exposure of said photosensitive composition, based on the sensitivity required of said photosensitive composition, and setting the composition of said photosensitive composition so that the diffusion length of the acid generated from said acid generating agent by said pattern exposure is greater than said average distance between said exposure particles.

2. A method of designing a chemical amplification type photosensitive composition containing an acid generating agent, comprising the steps of:

calculating the average distance between acids generated from said acid generating agent in an exposure area of said photosensitive composition upon pattern exposure of said photosensitive composition, based on the sensitivity required of said photosensitive composition, and setting the composition of said photosensitive composition so that the diffusion length of said acid in said photosensitive composition is greater than said average distance between said acids.

3. A lithography process in which a chemical amplification type photosensitive composition containing an acid generating agent is subjected to pattern exposure, followed by a developing treatment, said lithography process comprising the steps of:

calculating the average distance between exposure particles in an exposure area of said photosensitive composition upon said pattern exposure, based on the exposure dose at the time of said pattern exposure, and setting a lithography condition so that the diffusion length of an acid generated from said acid generating agent upon said pattern exposure is greater than said average distance between said exposure particles.

4. A lithography process as set forth in claim 3, wherein said lithography condition is a heating condition for said photosensitive composition before and after said pattern exposure.

5. A lithography process in which a chemical amplification type photosensitive composition containing an acid generating agent is subjected to pattern exposure, followed by a developing treatment, said lithography process comprising the steps of:

calculating the average distance between acids generated from said acid generating agent in an exposure area of said photosensitive composition upon said pattern exposure, based on the exposure dose at the time of said pattern exposure, and setting a lithography condition so that the diffusion length of said acid in said photosensitive composition is greater than said average distance between said acids.

6. A lithography process as set forth in claim 5, wherein said lithography condition is a heating condition for said photosensitive composition before and after said pattern exposure.

* * * * *